United States Patent [19]

Miyazaki et al.

[11] Patent Number: 5,717,710
[45] Date of Patent: Feb. 10, 1998

[54] OPTICAL SEMICONDUCTOR DEVICE

[75] Inventors: Yasunori Miyazaki; Eitaro Ishimura; Tatsuya Kimura, all of Itami, Japan

[73] Assignee: Mitsubishi Denki Kabushiki Kaisha, Tokyo, Japan

[21] Appl. No.: 558,791

[22] Filed: Nov. 15, 1995

[30] Foreign Application Priority Data

Dec. 5, 1994 [JP] Japan .................. 6-300647

[51] Int. Cl.⁶ .................................. H01S 3/19
[52] U.S. Cl. .................. 372/50; 372/26; 372/45; 372/46
[58] Field of Search .................. 372/46, 45, 50, 372/26

[56] References Cited

U.S. PATENT DOCUMENTS

| | | | |
|---|---|---|---|
| 4,660,208 | 4/1987 | Johnston, Jr. et al. | 372/46 |
| 4,774,554 | 9/1988 | Dentai et al. | 372/48 |
| 4,782,034 | 11/1988 | Dentai et al. | 437/94 |
| 4,888,624 | 12/1989 | Johnston, Jr. et al. | 357/16 |
| 4,999,315 | 3/1991 | Johnston, Jr. et al. | 439/94 |
| 5,539,763 | 7/1996 | Takemi et al. | 372/50 |
| 5,548,607 | 8/1996 | Tsang | 372/50 |

FOREIGN PATENT DOCUMENTS

| | | |
|---|---|---|
| 0314372 | 5/1989 | European Pat. Off. . |
| 0614253 | 9/1994 | European Pat. Off. . |
| 3286586 | 12/1991 | Japan . |
| 730185 | 1/1995 | Japan . |

OTHER PUBLICATIONS

Aoki et al., "High–Speed (10 Gbit/s) And Low–Drive–Voltage (1V Peak To Peak) InGaAs/InGaAsP MQW Electroabsorption–Modulator Integrated DFB Laser With Semi–Insulating Buried Heterostructure", Electronics Letters, vol. 28, No. 12, Jun. 1992, pp. 1157–1158.

Aoki et al., "InGaAs/InGaAsP MQW Electroabsorption Modulator Integrated With A DFB Laser Fabricated By Band–Gap Energy Control Selective Area MOCVD", IEEE Journal of Quantum Electronics, vol. 29, No. 6, 1993, pp. 2088–2096, Jun. 1993.

Soda et al., "High–Power and High–Speed Semi–Insulating BH Semi–Insulating BH Structure Monolithic Electroabsorption Modulator/DFB Laser Light Source", Electronics Letters., vol. 26, No. 1, pp. 9–10, Jan. 4, 1990.

Koch et al., "Semiconductor Photonic Integrated Circuits", IEEE Journal of Quantum Electronics, vol. 27, No. 3, pp. 641–653, Mar. 1, 1991.

Primary Examiner—James W. Davie
Attorney, Agent, or Firm—Leydig, Voit & Mayer, Ltd.

[57] ABSTRACT

In an optical semiconductor device including a DFB laser and a light absorption modulator, a semi-insulating semiconductor layer is disposed between a carrier blocking layer and a upper cladding layer, the upper cladding layer having an opposite conductivity type from that of the semiconductor substrate and disposed on a buried waveguide and the carrier blocking layer. The capacitance between the carrier blocking layer and the upper cladding layer is reduced. Therefore, mutual interference between the DFB laser and the light absorption modulator through the carrier blocking layer is reduced.

6 Claims, 6 Drawing Sheets

OPTICAL SEMICONDUCTOR DEVICE

FIELD OF THE INVENTION

The present invention relates to an optical semiconductor device and a fabricating method thereof, and more particularly, to an integrated optical semiconductor device in which electrical element isolation can easily be achieved between optical semiconductor elements and which is capable of high speed operation and to a fabricating method thereof.

BACKGROUND OF THE INVENTION

Development of an optical semiconductor device integrating a semiconductor laser and an optical modulator intended for an application to optical communications has advanced. In this optical semiconductor device, a distributed feedback (DFB) semiconductor laser is operated with direct current and light emitted from the laser undergoes high speed modulation by a light absorption modulator, which decreases wavelength chirping and is advantageous in high speed optical communications in contrast to direct modulation of the semiconductor laser.

A prior art optical semiconductor device integrating a DFB laser and a light absorption modulator, which is illustrated in "InGaAs/InGaAsP MQW Electroabsorption Modulator Integrated with a DFB Laser Fabricated by Band-Gap Energy Control Selective Area MOCVD," IEEE J. Quantum Electron., vol. 29, pp. 2088–2096, 1993 by M. Aoki et al. will be described. FIG. 5 is a perspective view of the prior art optical semiconductor device, a portion of which is sectioned. In the figure, reference numeral 2 designates an n type InP substrate, reference numeral 3 designates a bottom surface electrode, reference numeral 4 designates a light absorption layer of the optical modulator, reference numeral 7 designates a top surface electrode, reference numeral 8 designates a semi-insulating Fe-doped InP layer, reference numeral 9 designates an n type InP hole blocking layer, reference numeral 11 designates an active layer of the DFB laser, reference numeral 12 designates a diffraction grating, reference numeral 14 designates a buried waveguide, reference numeral 35 designates a p type InP upper cladding layer, reference numeral 101 designates the DFB laser, and reference numeral 102 designates the optical modulator. The DFB laser is equipped with the diffraction grating 12 under the active layer which makes possible to steady laser emission at a single wavelength. The active layer 11 of the DFB laser 101 and the light absorption layer 4 of the optical modulator 102 comprise a continuous InGaAs/InGaAsP multiple quantum well layer. Its thickness is large in the DFB laser and small in the optical modulator and the width of each quantum well included in this layer is also smaller in the optical modulator than in the DFB laser. Therefore, the energy difference between ground levels of the conduction band and the valence band inside the quantum well of the DFB laser is smaller than that in the optical modulator. Therefore, when no bias voltage is applied to the optical modulator, light from the DFB laser is not absorbed in the light absorption layer 4. However, if a reverse bias voltage is applied to the optical modulator, the light is absorbed due to the quantum confinement Stark effect (QCSE). Because of this, the light radiated from the DFB laser operated by a direct current can be modulated by changing the bias voltage applied to the optical modulator. The semi-insulating Fe-doped InP layer 8 and the n type InP hole blocking layer 9 fill in both sides of the buried waveguide comprising the multiple quantum well layer and the InP cladding layers disposed above and below this multiple quantum well layer and act as a current blocking layer. This reduces the threshold current of the laser, improving the efficiency of the laser.

FIG. 6(a) is a cross-sectional view of the optical modulator of the prior art optical semiconductor device. Since Fe is a deep acceptor in InP, the semi-insulating Fe-doped InP layer 8 can block the diffusion of electrons from the n type InP substrate 2 and the n type InP hole blocking layer 9 can block the diffusion of holes from the p type InP upper cladding layer 35. A schematic view of a cross-section when this optical semiconductor device is sectioned through a broken line 6b—6b in FIG. 6(a) along a plane parallel to the buried waveguide is shown in FIG. 6(b). The interface between the n type InP hole blocking layer 9 and the p type InP upper cladding layer 35 is a pn junction interface, and the junction capacitance $C_1$ becomes too large to be ignored for high speed operation of the optical modulator. The junction capacitance $C_3$ in the DFB laser also becomes as large as $C_1$. On the other hand, the capacitances $C_2$ and $C_4$ between the n type InP hole blocking layer 9 and the n type InP substrate 2 are sufficiently smaller than $C_1$ and $C_3$ because of the thick semi-insulating Fe-doped InP layer 8 between these layers. Since the mobility of electrons is considerably larger than that of holes in InP, the an electrical resistance of the n type InP hole blocking layer 9 is small. Therefore, if the hole blocking layer 9 is continuous through the optical modulator and the DFB laser, there occurs mutual interference between the modulator and the DFB laser and the capacitance $C_3$ becomes associated with the capacitance $C_1$, thereby increasing parasitic capacitance of the optical modulator and impeding modulation at high frequencies. This means that the modulation bandwidth is narrowed. In order to avoid these problems, a portion 36 of the hole blocking layer 9 between the optical modulator 102 and the DFB laser 101 is etched away as shown in FIG. 6(b).

The fabricating method of the prior art optical semiconductor device will briefly be described. First, after forming the diffraction grating 12 in the DFB laser formation region of the n type InP substrate surface, two stripe shaped $SiO_2$ films (15 μm width, respectively) disposed on both sides of a region (10 μm width) which becomes the buried waveguide of the DFB laser formation region are formed. Next, InGaAs/InGaAsP multiple quantum well layer is selectively grown using metal organic chemical vapor deposition (hereinafter referred to as "MOCVD") on a region except the $SiO_2$ region. When this multiple quantum well layer is formed, since the distance of 10 μm separating the two $SiO_2$ stripes is sufficiently smaller than the vapor phase diffusion length of 30–50 μm of materials forming a growing layer, the thickness of the multiple quantum well layer grown on the region between these $SiO_2$ stripes becomes larger than that of the same multiple quantum well layer grown on a region outside that region. Next, etching is performed so that the multiple quantum well layer is left only on the region between the $SiO_2$ stripes and on a region adjacent that region, where the optical modulator is formed, thereby forming the buried waveguide. Furthermore, after the semi-insulating Fe-doped InP layer 8 and the n type InP hole blocking layer 9 are selectively grown on both sides of the buried waveguide, a portion of the n type InP hole blocking layer 9 between the DFB laser and the optical modulator is etched away. Next, the selective growth mask on the buried waveguide is removed, and the p type InP upper cladding layer 35 is grown on the entire surface as shown in FIG. 7. In the figure, reference numeral 36 indicates the portion where the n type InP hole blocking layer 9 was removed. Reference numeral 37 designates the buried waveguide region, where the hole blocking layer was not formed from the beginning. Finally, mesa etching for element isolation is performed and the top surface and the bottom surface electrodes are formed, thereby completing the optical semiconductor device illustrated in FIG. 5.

As described above, in the prior art integrated semiconductor laser and optical modulator, it is necessary to etch and remove a portion of the n type InP hole blocking layer between the laser and the modulator in order to isolate the elements. However, it is difficult to selectively etch only the hole blocking layer because of the lack of controllability of the etching rate, and the surface of the semi-insulating Fe-doped InP layer under the hole blocking layer is also likely to be etched. Therefore, there is a probability that the side of the multiple quantum well layer will be exsposed contaminated and damaged.

Furthermore, the etching of the hole blocking layer is performed after a region, except the region to be etched, is masked with a resist in a photolithography process. However, even when the etching is completed and the resist mask is removed, a certain amount of contamination is left on the surface of the hole blocking layer. This degrades the crystallinity of the p type InP upper cladding layer which is grown on this surface.

SUMMARY OF THE INVENTION

It is an object of the present invention to provide an integrated optical semiconductor device having a superior element isolation characteristic and broad modulation bandwidth.

It is another object of the present invention to provide a method for fabricating the optical semiconductor device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an optical semiconductor device has burying semiconductor layers disposed on both sides of a buried waveguide which serves for each of a plurality of optical semiconductor elements that are formed on a semiconductor substrate, and forming a continuous layer extending through the plural optical semiconductor elements. Furthermore, the burying semiconductor layer comprises a single pair of or a plurality of pairs of semiconductor layers laminated on a semi-insulating semiconductor layer, the one pair of the laminated layers comprising a carrier blocking layer comprising semiconductor of the same conductivity type as that of the semiconductor substrate, and a semi-insulating semiconductor layer formed on the carrier blocking layer. Therefore, the semi-insulating semiconductor layer is disposed between the carrier blocking layer and an upper cladding layer which is usually formed on the buried waveguide and the carrier blocking layer and comprises semiconductor of a conductivity type opposite to that of the semiconductor substrate, whereby the capacitance between the upper cladding layer and the carrier blocking layer is reduced to a value lower than that of the prior art optical semiconductor device having a pn junction formed by those two layers. Therefore, a mutual interference between optical semiconductor devices through the carrier blocking layer is reduced, and the parasitic capacitance of the device is also reduced, thereby enabling the device operating up to a higher frequency than in the prior art.

According to a second aspect of the present invention, in the above optical semiconductor device, as the plurality of optical semiconductor elements, there are a laser element and an optical modulator element, both of which have the buried waveguides forming a continuous layer. Therefore, the semi-insulating semiconductor layer is disposed between the carrier blocking layer and an upper cladding layer which is usually formed on the buried waveguide and the carrier blocking layer and comprises semiconductor of a conductivity type opposite to that of the semiconductor substrate, whereby the capacitance between the upper cladding layer and the carrier blocking layer is reduced to a value lower than that of the prior art optical semiconductor device having a pn junction formed by those two layers. Therefore, a mutual interference between optical semiconductor devices through the carrier blocking layer is reduced, and the parasitic capacitance of the device is also reduced, thereby enabling the device operating up to a higher frequency than in the prior art.

According to a third aspect of the present invention, in the above optical semiconductor device, the semi-insulating semiconductor layer comprises InP doped with Fe and the conductivity type of semiconductor forming the carrier blocking layer is n type. Therefore, the InP layer which is semi-insulating due to including Fe which serves as a deep acceptor is disposed between the carrier blocking layer and an upper cladding layer which comprises p type semiconductor which is a conductivity type opposite to that of the semiconductor substrate, whereby the capacitance between the upper cladding layer and the carrier blocking layer is reduced to a value lower than the prior art optical semiconductor device having a pn junction formed by those two layers. Therefore, a mutual interference between optical semiconductor devices through the n type carrier blocking layer is reduced, and the parasitic capacitance of the device is also reduced, thereby enabling the device operating up to a higher frequency than in the prior art. Furthermore, since Fe serves as a deep acceptor in the Fe-doped semi-insulating InP layer as described above, a diffusion of electrons from the n type semiconductor substrate can be effectively blocked.

According to a fourth aspect of the present invention, in the above optical semiconductor device, the semi-insulating semiconductor layer comprises InP doped with Ti and the conductivity type of semiconductor forming the carrier blocking layer is n type. Therefore, the InP layer which is semi-insulating due to including Ti serving as a deep acceptor is disposed between the carrier blocking layer and an upper cladding layer which is usually formed on the buried waveguide and the carrier blocking layer and comprises p type semiconductor which is a conductivity type opposite to that of the semiconductor substrate, whereby the capacitance between the upper cladding layer and the carrier blocking layer is reduced to a value lower than that of the prior art optical semiconductor device having a pn junction formed by those two layers. Therefore, a mutual interference between optical semiconductor devices through the n type carrier blocking layer is reduced, and the parasitic capacitance of the device is also reduced, thereby enabling the device operating up to a higher frequency than in the prior art. Furthermore, since Ti serves as a deep acceptor in the Ti-doped semi-insulating InP layer as described above, a diffusion of electrons from the n type semiconductor substrate can be effectively blocked.

According to a fifth aspect of the present invention, in the above optical semiconductor device, the semi-insulating semiconductor layer comprises InP doped with Cr and the conductivity type of the semiconductor forming the carrier blocking layer is p type. Therefore, the InP layer which is semi-insulating due to including Cr which serves as a deep donor is disposed between the carrier blocking layer and an upper cladding layer which is usually formed on the buried waveguide and the carrier blocking layer and comprises n type semiconductor which is a conductivity type opposite to that of the semiconductor substrate, whereby the capacitance between the upper cladding layer and the carrier blocking layer is reduced to a value lower than that of the prior art optical semiconductor device having a pn junction formed by those two layers. Therefore, a mutual interference between optical semiconductor devices through the p type carrier blocking layer is reduced, and the parasitic capacitance of the device is also reduced, thereby enabling the device operating up to a higher frequency than in the prior art. Furthermore, since Cr serves as a deep donor in the Cr-doped semi-insulating InP layer as described above, a diffusion of holes from the p type semiconductor substrate can be effectively blocked.

According to a sixth aspect of the present invention, in the above optical semiconductor device, the semi-insulating semiconductor layer comprises non-doped AlInAs. Therefore, the semi-insulating non-doped AlInAs layer is disposed between the carrier blocking layer and an upper cladding layer which is usually formed on the buried waveguide and the carrier blocking layer and comprises n type semiconductor which is a conductivity type opposite to that of the semiconductor substrate, whereby the capacitance between the upper cladding layer and the carrier blocking layer is reduced to a value lower than that of the prior art optical semiconductor device having a pn junction formed by those two layers. Therefore, a mutual interference between optical semiconductor devices through the carrier blocking layer is reduced, and the parasitic capacitance of the device is also reduced, thereby enabling the device operating up to a higher frequency than in the prior art. Furthermore, since AlInAs has a larger band gap than InP or the like, the semi-insulating non-doped AlInAs layer can effectively block a diffusion of carriers from the semiconductor substrate or the cladding layer which comprise InP or the like.

According to a seventh aspect of the present invention, a fabricating method of an optical semiconductor device includes a process of forming a layer which serves as a buried waveguide for each of a plurality of optical semiconductor elements on a semiconductor substrate, and a process of growing a semi-insulating semiconductor layer and subsequently a single pair or plural pairs of semiconductor layers, one pair of the semiconductor layers comprising a carrier blocking layer comprising semiconductor of the same conductivity type as that of the semiconductor substrate and a semi-insulating semiconductor layer, on both sides of the buried waveguide, such that a continuous layer is formed extending throughout the plural semiconductor elements, thereby forming a burying semiconductor layer comprising the semiconductor layer and the single pair or plural pairs of semiconductor layers. Therefore, the semi-insulating semiconductor layer is formed between the carrier blocking layer and an upper cladding layer which comprises semiconductor of a conductivity type opposite to that of the semiconductor substrate and is usually formed on the buried waveguide and the carrier blocking layer, and thus the capacitance between these layers is reduced with relative to that in the prior art. Therefore, a mutual interference between optical semiconductor elements can be reduced without a portion of the carrier blocking layer between the optical semiconductor elements being etched away, and the parasitic capacitances of the elements are reduced, thereby enabling the optical semiconductor device operate up to a higher frequency than in the prior art. Furthermore, it differs from the prior art fabricating method in that no process of etching a portion of the carrier blocking layer between optical semiconductor elements is required before growing the upper cladding layer, and no photolithography process is required for the etching. Therefore, there occur no contaminations on the surface of the semi-insulating semiconductor layer which is the uppermost layer and crystallinity of the upper cladding layer which is grown on this layer is kept excellent, providing a high reliability optical semiconductor device. Furthermore, because no process for etching only the carrier blocking layer which is difficult in its control is required for etching the region between the optical semiconductor elements, the fabrication yield of the optical semiconductor device can be improved.

According to an eighth aspect of the present invention, in the above fabricating method of an optical semiconductor device, a plurality of optical semiconductor elements are a laser element and an optical modulator element and in the process of forming the buried waveguide a continuous semiconductor layer extending throughout the laser element and the optical modulator element is formed on the semiconductor substrate. Therefore, the semi-insulating semiconductor layer is formed between the carrier blocking layer and an upper cladding layer which is usually formed on both the buried waveguide and the carrier blocking layer and comprises semiconductor of a conductivity type opposite to that of the semiconductor substrate, and thus the capacitance between the upper cladding layer and the carrier blocking layer is reduced to a value lower than that of the prior art optical semiconductor device having a pn junction formed by these two layers. Therefore, a mutual interference between the laser element and the optical semiconductor modulator element can be reduced without etching away a portion of the carrier blocking layer between the laser element and the optical modulator element, and parasitic capacitance of the optical semiconductor modulator element is reduced, whereby the modulation bandwidth is made broader than in the prior art device. Furthermore, it differs from the prior art fabricating method in that no process of etching a portion of the carrier blocking layer between optical semiconductor elements is required before growing the upper cladding layer, and no photolithography process is required for the etching. Therefore, there occur no contaminations on the surface of the semi-insulating semiconductor layer which is the uppermost layer, and crystallinity of the upper cladding layer which is grown on this layer is kept excellent, providing a high reliability optical semiconductor device. Furthermore, because no process for etching only the carrier blocking layer which is difficult in its control is required for etching the region between the optical semiconductor elements, the fabrication yield of the optical semiconductor device can be improved.

DETAILED DESCRIPTION OF THE PREFERRED EMBODIMENTS

Embodiment 1.

A first embodiment of the present invention will be described.

Figure 1:
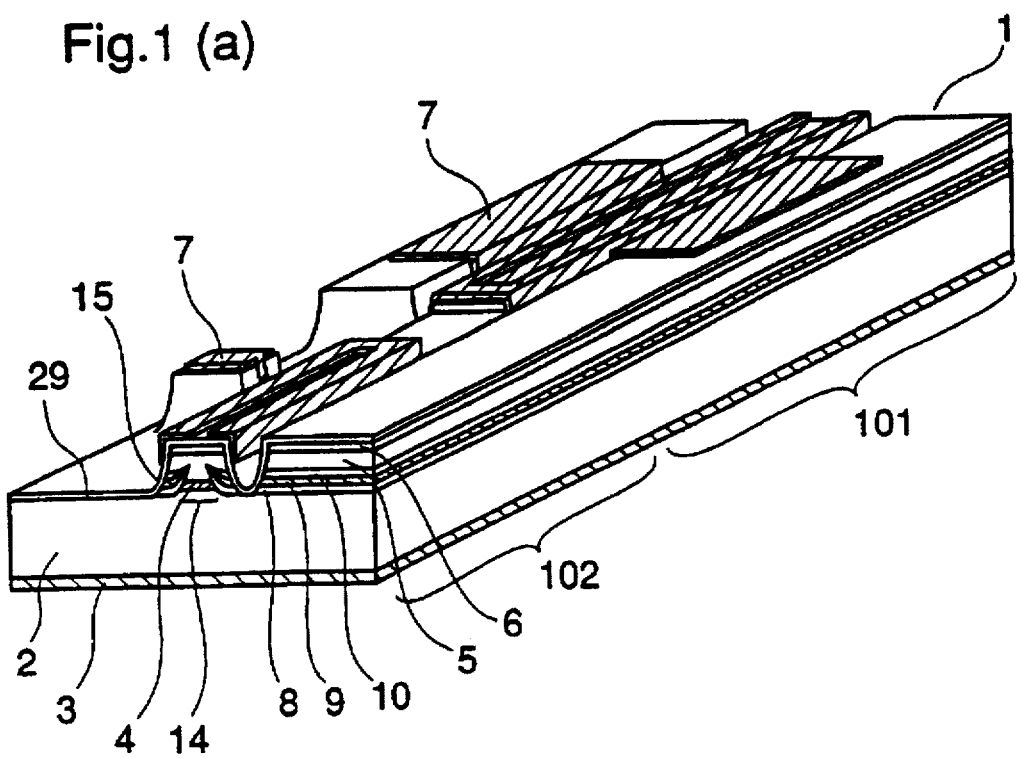
FIG. 1(a) is a perspective view illustrating an optical semiconductor device integrating a DFB laser and an optical modulator according to a first embodiment of the present invention and FIG. 1(b) is a perspective view of the device of FIG. 1(a) with a portion thereof removed.
Figure 1:
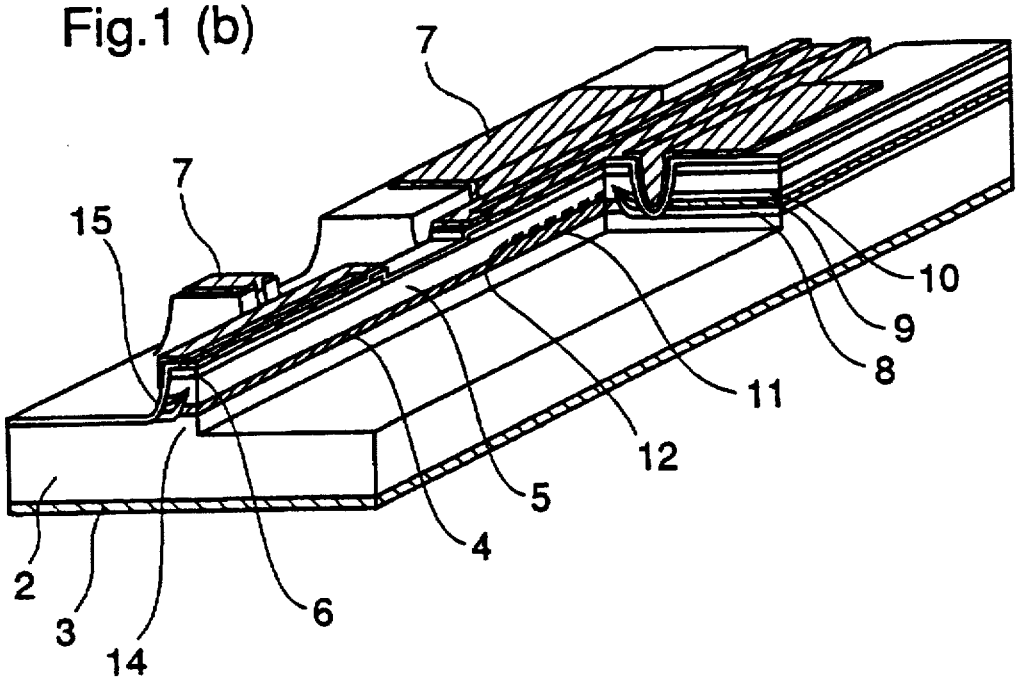

An optical semiconductor device (a semiconductor laser with an optical modulator) integrating a DFB laser and a light absorption modulator according to the first embodiment is shown in FIGS. 1(a) and 1(b). FIG. 1(a) is a perspective view of this optical semiconductor device and FIG. 1(b) is a perspective view of the same optical semiconductor device with a portion thereof removed. In the figures, reference numeral 1 designates a body of the semiconductor laser with the optical modulator, reference numeral 2 designates an n type InP substrate, reference numeral 3 designates a Ti/Pt/Au bottom surface electrode, reference numeral 4 designates an InGaAs/InGaAsP multiple quantum well light absorption layer, reference numeral 5 designates a p type InP second upper cladding layer, reference numeral 6 designates a p type InGaAs contact layer, reference numeral 7 designates a Cr/Au top surface electrode, reference numeral 8 designates a lower semi-insulating Fe-doped InP layer, reference numeral 9 designates an n type InP hole blocking layer, reference numeral 10 designates an upper semi-insulating Fe-doped InP layer, reference numeral 11 designates an InGaAs/InGaAsP multiple quantum well active layer, reference numeral 12 designates an InGaAsP buried diffraction grating, reference numeral 14 designates an active layer mesa (a buried waveguide), reference numeral 15 designates a process mesa, reference numeral 29 designates an SiO$_2$ protective film, reference numeral 101 designates a DFB laser, and reference numeral 102 designates a light absorption modulator.

The principle of laser oscillation and light modulation in the optical semiconductor device according to this embodiment is fundamentally the same as in the described prior art optical semiconductor device. That is, the InGaAsP buried diffraction grating 12 beneath the active layer of the DFB laser is for stably lasing with a single wavelength. Further, the active layer 11 of the DFB laser 101 and the light absorption layer 4 of the optical modulator 102 is formed from the continuous InGaAs/InGaAsP multiple quantum well layer, and this layer is thick in the DFB laser and thin in the optical modulator, and the width of each quantum well included in this layer is narrower in the optical modulator than in the DFB laser. Consequently, the energy difference between the bottom levels of the conduction band and the valence band inside the quantum well of the DFB laser is smaller than that of the optical modulator, and when no bias voltage is applied to the optical modulator, light from the DFB laser is not absorbed in the light absorption layer 4. However, when a reverse bias voltage is applied to the optical modulator, the light is absorbed due to the quantum confinement Stark effect (QCSE). In this way, the light radiated from the DFB laser driven by a direct current can be modulated by changing the bias voltage applied to the optical modulator. In other words, the intensity of the light emitted from the light absorption modulator facet changes in response to the bias voltage applied to the modulator.

Figure 2:
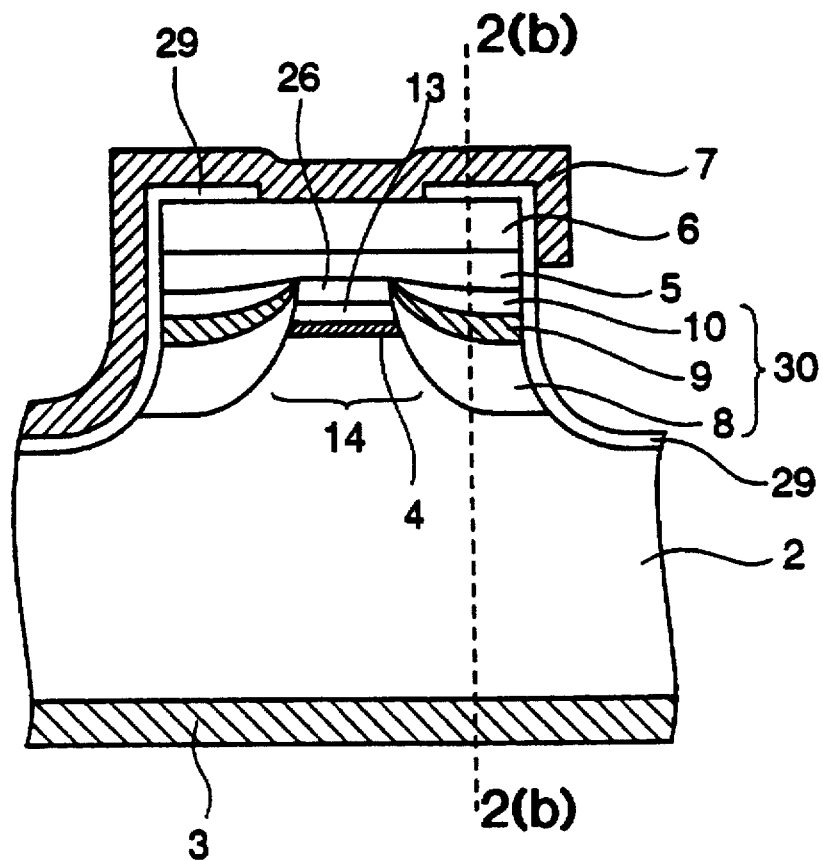
FIG. 2(a) is a cross-sectional view at a surface perpendicular to the buried waveguide illustrating the optical modulator of the optical semiconductor device integrating a DFB laser and an optical modulator according to the first embodiment of the present invention and FIG. 2(b) is a cross-sectional view along a plane parallel to the buried waveguide through a broken line 2b—2b of FIG. 2(a) illustrating the optical semiconductor device of FIG. 2(a).
Figure 2:
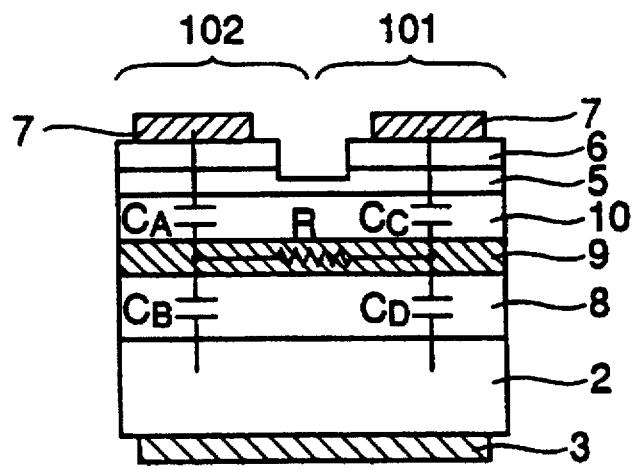
Figure 6:
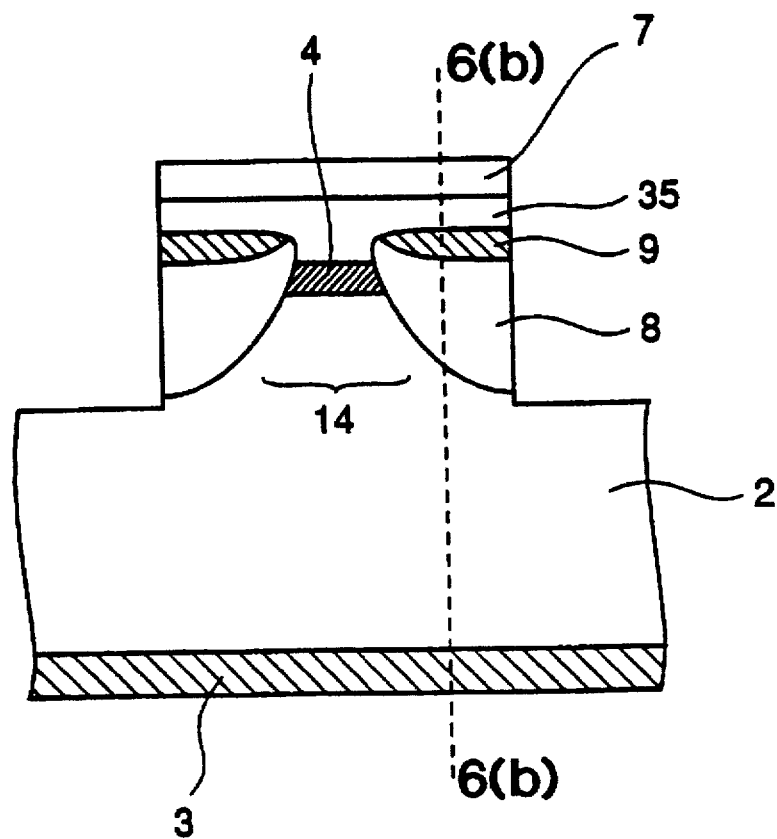
FIG. 6(a) is a cross-sectional view at a surface perpendicular to the buried waveguide illustrating the optical modulator of the prior art optical semiconductor device integrating a DFB laser and an optical modulator and FIG. 6(b) is a cross-sectional view along a plane parallel to the buried waveguide through a broken line 6b—6b of FIG. 6(a) illustrating the optical semiconductor device.
Figure 6:
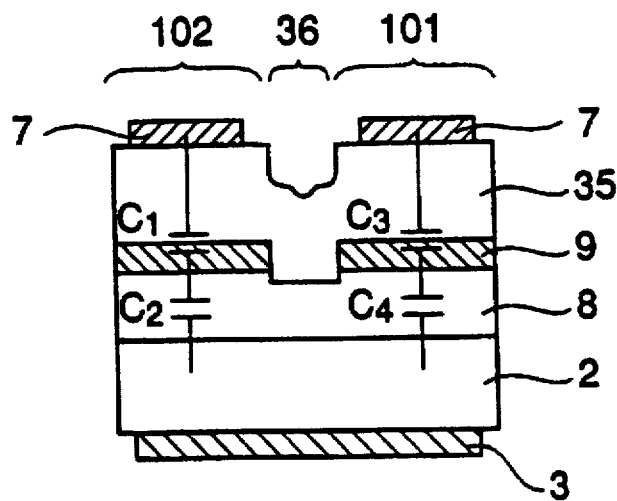
Figure 7:
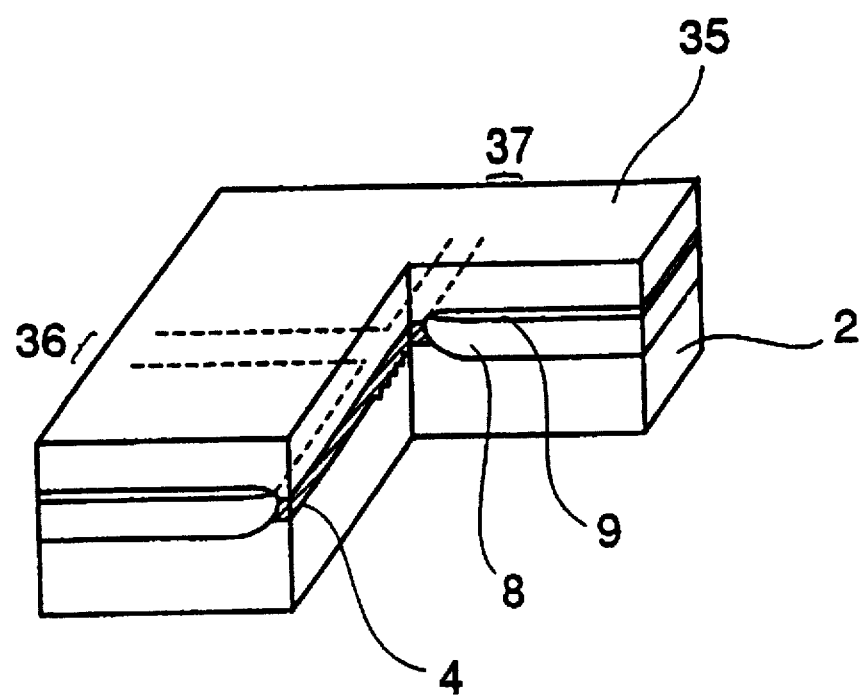
FIG. 7 is a perspective view illustrating a method of fabricating the prior art optical semiconductor device integrating a DFB laser and an optical modulator.

The optical semiconductor device according to this embodiment differs from the described prior art optical semiconductor device in that there are burying layers on both sides of the buried waveguide. A cross-sectional view of the optical modulator is illustrated in FIG. 2(a). In this figure, reference numeral 13 designates a p type InP cladding layer, reference numeral 26 designates a p type InP first upper cladding layer, and reference numeral 30 designates the burying layers on both sides of the buried waveguide. As can be seen from the figure, the burying layer 30 on both sides of the buried waveguide is formed by the lower semi-insulating Fe-doped InP layer 8, the n type InP hole blocking layer 9, and the upper semi-insulating Fe-doped InP layer 10. Since Fe is a deep acceptor in InP, the lower semi-insulating Fe-doped InP layer 8 can block the diffusion of electrons from the n type InP substrate, and the n type InP hole blocking layer 9 blocks the diffusion of holes from the p type InP upper cladding layer. A schematic view of a cross-section of this optical semiconductor device in a plane parallel to the buried waveguide through a broken line 2b—2b in FIG. 2(a) is shown in FIG. 2(b). In contrast to the above described prior art optical semiconductor device in which the n type InP hole blocking layer and the p type InP upper cladding layer directly contact each other, the interface forming a pn junction, in the optical semiconductor device according to this embodiment, there is an upper semi-insulating Fe-doped InP layer 10 between the n type InP hole blocking layer 9 and the p type InP second upper cladding layer 5. Therefore, the capacitances $C_A$ and $C_C$ between the hole blocking layer 9 and the second upper cladding layer 5 illustrated in FIG. 2(b) are significantly smaller than the capacitances ($C_1$ and $C_3$ in FIG. 6(b)) between these two layers in the prior art. Further, the capacitances $C_B$ and $C_D$ between the hole blocking layer 9 and the n type InP substrate 2 are as small as $C_A$ and $C_C$. Since the low resistance n type InP hole blocking layer 9 is continuous through the DFB laser 101 and the optical modulator 102, $C_A$ is associated with $C_C$ and $C_D$ via the resistance R of this layer. However, $C_A$ and $C_C$ are significantly smaller than those capacitances in the prior art as described above, the mutual interference between the DFB laser and the optical modulator through this path formed by the hole blocking layer 9 is sufficiently reduced. That is, the electrical isolation of these elements is possible without etching and removing a portion of the hole blocking layer between the DFB laser and the optical modulator as in the prior art. Furthermore, since the parasitic capacitance $C_A$ of the optical modulator is small and the parasitic capacitances ($C_C$ and $C_D$) of the DFB laser are also small as described above, it is possible to operate the optical modulator at higher frequencies in this embodiment. In other words, the modulation bandwidth of the optical modulator can be broadened.

Figure 3:
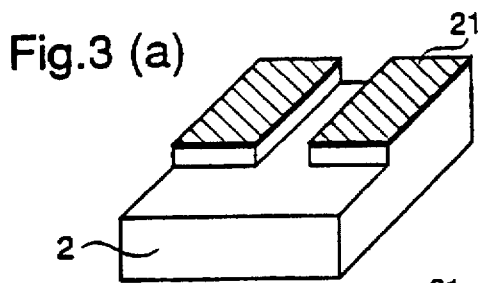
FIGS. 3(a)-3(k) are perspective views illustrating a method of fabricating the optical semiconductor device integrating a DFB laser and an optical modulator according to the first embodiment of the present invention.
Figure 3:
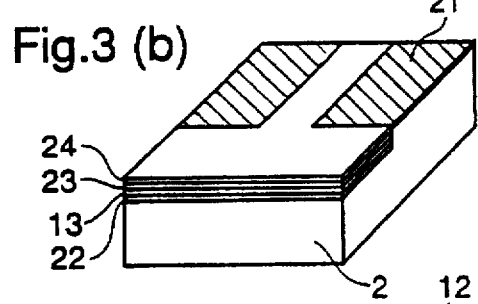
Figure 3:
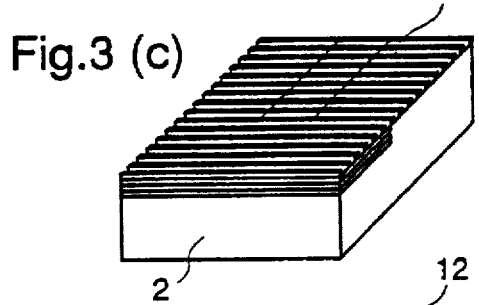
Figure 3:
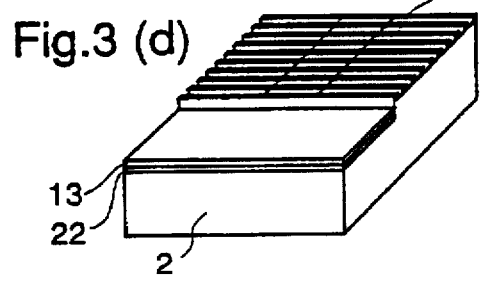
Figure 3:
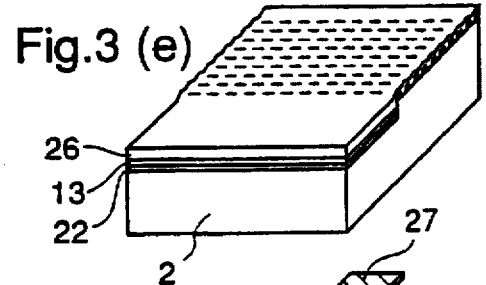
Figure 3:
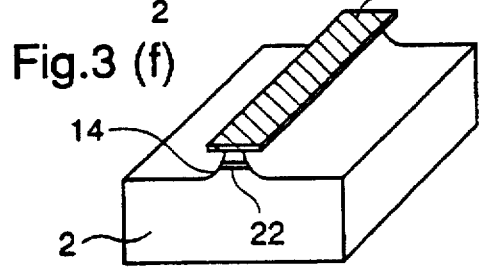
Figure 3:
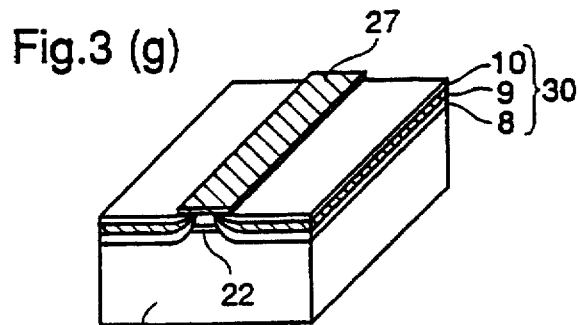
Figure 3:
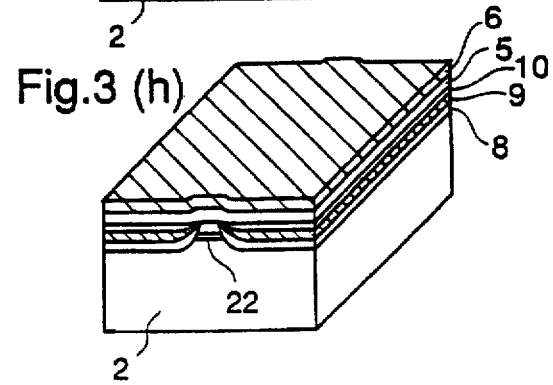
Figure 3:
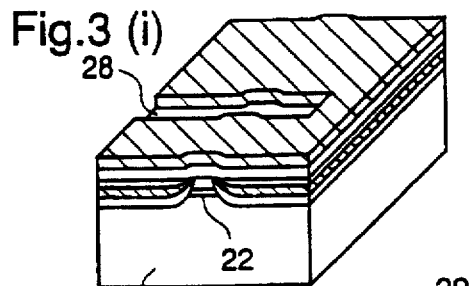
Figure 3:
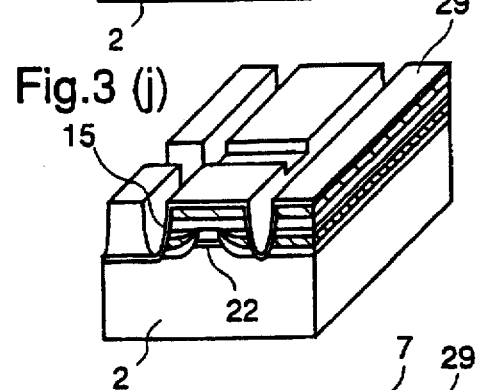
Figure 3:
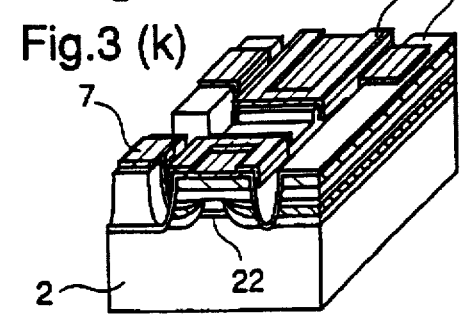

A method of fabricating the optical semiconductor device according to this embodiment will be described. First, as illustrated in FIG. 3(a), two stripe shaped $SiO_2$ selective growth masks 21 are formed on opposite sides of a region, which becomes the buried waveguide, of the DFB laser forming region on the surface of the n type InP substrate 2, and regions of the substrate, except this masked region, are etched to a prescribed depth. Next, as illustrated in FIG. 3(b), the InGaAs/InGaAsP multiple quantum well layer 22, the p type InP cladding layer 13, the InGaAsP guide layer 23, and the p type InP cap layer 24 are successively grown on the region except the $SiO_2$ mask region using MOCVD. During this process, the thickness of the growth layer on the region between the $SiO_2$ masks becomes larger than that of the layers grown on the other region. Therefore, the thickness of the multiple quantum well layer 22 becomes larger than that of the same multiple quantum well layer grown on the other region. Then, the $SiO_2$ masks are removed. Next, as illustrated in FIG. 3(c), after disposing a photoresist on the entire surface, a periodic resist pattern is formed using the interference exposure method, and, using this resist as a mask, the p type InP cap layer 24 and the InGaAsP guide layer 23 are etched, thereby forming the diffraction grating 12 having a periodic pattern. Furthermore, as illustrated in FIG. 3(d), by etching the p type InP cap layer 24 and the InGaAsP guide layer 23 at a region where the optical modulator is formed, the diffraction grating 12 is left on the region where the DFB laser is formed. Then, as illustrated in FIG. 3(e), the p type InP first upper cladding layer 26 is grown on the entire surface using MOCVD. Next, as illustrated in FIG. 3(f), the $SiO_2$ etching mask 27 is formed on the region where the buried waveguide is formed, and using this mask, wet etching is performed and the active layer mesa 14 (buried waveguide) is formed. Next, as illustrated in FIG. 3(g) the lower semi-insulating Fe-doped InP layer 8, the n type InP hole blocking layer 9, and the upper semi-insulating Fe-doped InP layer 10 are successively and selectively grown on both sides of the active layer mesa using MOCVD, thereby forming the burying layer 30. Next, as illustrated in FIG. 3(h), after removing the $SiO_2$ etching mask 27, the p type InP second upper cladding layer 5 and the p type InGaAs contact layer 6 are successively grown on the entire surface using MOCVD. Then, the portion of the p type InGaAs contact layer 6 between the DFB laser and the optical modulator is etched are removed and an isolation groove 28 is formed. Next, as illustrated in FIG. 3(j), after the regions on both sides of the region where the DFB laser and the optical modulator are formed are etched, thereby forming the process mesa 15, the $SiO_2$ protective film 29 is disposed on the entire surface by sputtering. Next, the portions of the $SiO_2$ protective film 29 directly above the active layer of the DFB laser and the light absorption layer of the optical modulator are removed, and the Cr/Au film is disposed on the entire surface by evaporation. Then, as illustrated in FIG. 3(k), the region where the top surface electrode is formed is plated with Au, and by etching the Cr/Au film using this Au plating layer as a mask, the Cr/Au top surface electrode 7 is formed. Finally, after grinding the bottom surface of the n type InP substrate 2, the Ti/Pt/Au bottom surface electrode is formed, thereby obtaining the optical semiconductor device integrating a DFB laser and a light absorption modulator illustrated in FIG. 1.

The method of fabricating the optical semiconductor device according to this embodiment differs from the previously described prior art fabricating method in that there is no process of etching and removing a portion of the n type InP hole blocking layer 9 between the DFB laser and the optical modulator before growing the p type InP second upper cladding layer. Therefore, no photolithography process is performed for that etching and consequently, no contamination of the surface of the upper semi-insulating Fe-doped InP layer occurs and the crystallinity of the p type InP second upper cladding layer, which grows on the surface of the upper semi-insulating Fe-doped InP layer, is kept excellent, thereby producing a highly reliable optical semiconductor device. Furthermore, since it includes no process of etching and removing only the portion of the n type InP hole blocking layer 9 between the DFB laser and the optical modulator, which is difficult in its control, the yield of optical semiconductor devices can be improved.

Since Ti serves as a deep acceptor like Fe, in InP, Ti-doped InP can be used for the semi-insulating InP layers 8 and 10 in place of Fe-doped InP, and a similar effect is obtained.

Furthermore, since Cr serves as a deep donor in InP, Cr-doped InP can be used for the semi-insulating InP layers 8 and 10 in place of the Fe-doped InP, and similar effects as described above are obtained. In this case, however, the conductivity types of respective layers must be opposite to those described above. That is, the InP substrate and the hole blocking layer should be p type and the upper cladding layer should be n type. In this case, the hole blocking layer is replaced by an electron blocking layer for blocking the diffusion of electrons from the n type upper cladding layer.

Semi-insulating non-doped AlInAs can be used for the semi-insulating InP layers 8 and 10 in place of Fe-doped InP, and similar effects as described above are obtained. This is because the band gap energy of the AlInAs is larger than that of InP and this can effectively block the diffusion of carriers (electrons and holes) from the InP layers.

Embodiment 2.

A second embodiment of the present invention will be described.

Figure 4:
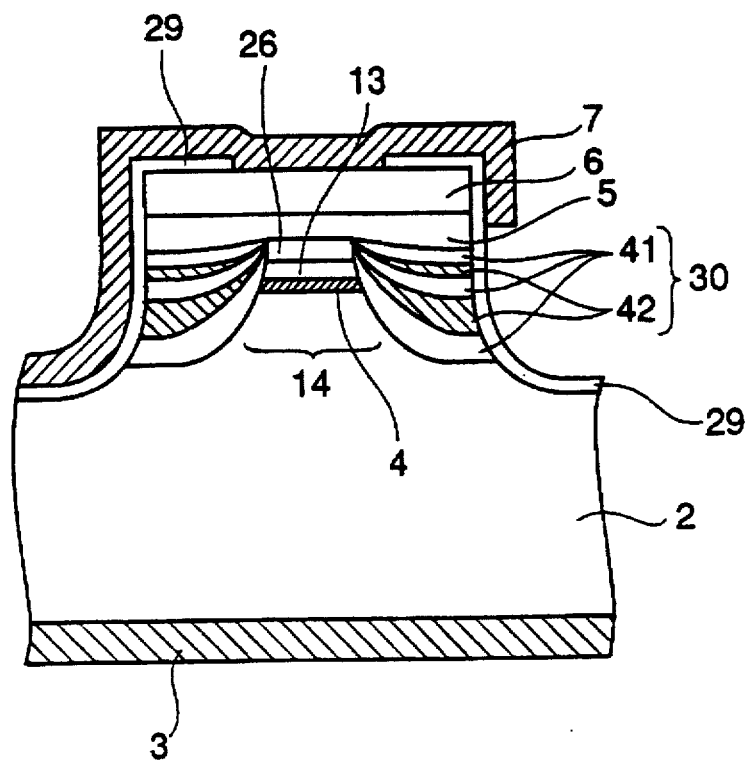
FIG. 4 is a cross-sectional view at a surface perpendicular to a buried waveguide illustrating an optical modulator of an optical semiconductor device integrating a DFB laser and an optical modulator according to a second embodiment of the present invention.
Figure 5:
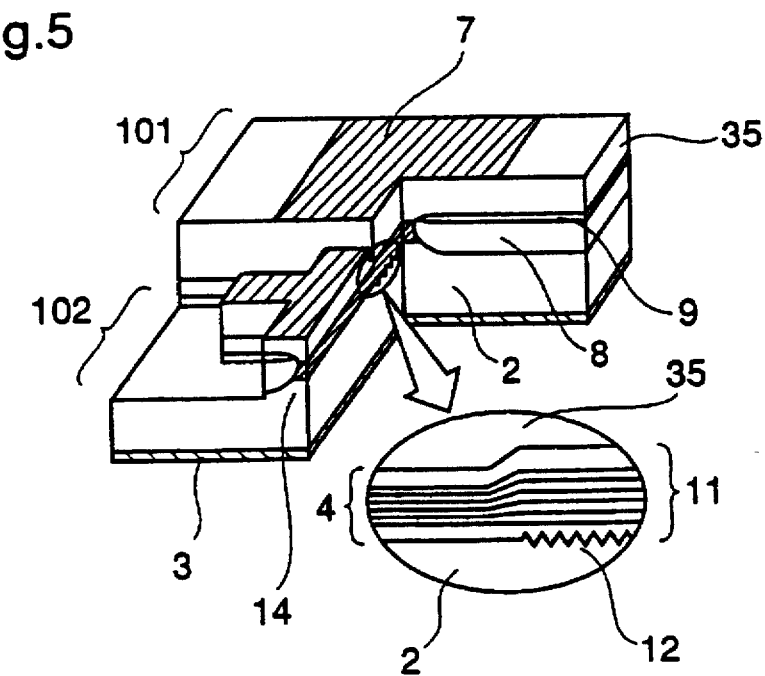
FIG. 5 is a perspective view illustrating a prior art optical semiconductor device integrating a DFB laser and an optical modulator with a portion thereof removed.

A cross-section of an optical modulator of an optical semiconductor device according to this embodiment, integrating a DFB laser and a light absorption modulator, is illustrated in FIG. 4. As can be seen from the figure, the burying layer 30 on both sides of the buried waveguide 14 comprises three layers of semi-insulating Fe-doped InP layer 41 and two layers of n type InP, hole blocking layer 42, alternately laminated on each other. The structures other than this burying layer are the same as the optical semiconductor device of the first embodiment for both the DFB laser and the optical modulator. That is, in FIG. 4, reference numeral 2 designates an n type InP substrate, reference numeral 3 designates a Ti/Pt/Au bottom surface electrode, reference numeral 4 designates an InGaAs/InGaAsP multiple quantum well light absorption layer, reference numeral 5 designates a p type InP second upper cladding layer, reference numeral 6 designates a p type InGaAs contact layer, reference numeral 7 designates a Cr/Au top surface electrode, reference numeral 13 designates a p type InP cladding layer, reference numeral 26 designates a p type InP first upper cladding layer, and reference numeral 29 designates an $SiO_2$ protective film.

Since in the optical semiconductor device of this embodiment there is also the upper semi-insulating Fe-doped InP layer 41 between the upper n type InP hole blocking layer 42 and the p type InP second upper cladding layer 5, the capacitance between the hole blocking layer 42 and the second upper cladding layer 5 is significantly smaller than the pn junction capacitance between the two corresponding layers in the prior art. Since the low resistance n type InP hole blocking layer 42 is continuous through the DFB laser and the optical modulator, the capacitance on the modulator side is associated with the capacitance on the DFB laser side through the resistor of this layer. However, as described above, the capacitance on the modulator side is sufficiently smaller than that in the prior art, and the mutual interference between the DFB laser and the optical modulator in this path is reduced. That is, the electrical isolation of these elements is possible without etching and removing the portion of the hole blocking layer between the DFB laser and the optical modulator as in the prior art. Furthermore, since the parasitic capacitance of the optical modulator is small and the parasitic capacitance of the DFB laser which is associated with the former is small, it is possible to operate the optical modulator at a higher frequency in this embodiment. In other words, the modulation bandwidth of the optical modulator can be broadened.

In the method of fabricating the optical semiconductor device according to the second embodiment, the burying layers 30 on both sides of the buried waveguide are grown such that three semi-insulating Fe-doped InP layers 41 and two n type InP hole blocking layers 42 are alternately grown as illustrated in FIG. 4. Other than the process of growing this burying layer, the fabricating method is the same as the first embodiment. The method of fabricating an optical semiconductor device of this embodiment differs from the prior art fabricating method in that no process is required for etching and removing a portion of the n type InP hole blocking layer 42 between the DFB laser and the optical modulator before growing the p type InP second upper cladding layer. Therefore, no photolithography process is performed for the etching and consequently, no contamination of the surface of the uppermost semi-insulating Fe-doped InP layer 41 occurs and the crystallinity of the p type InP second upper cladding layer 5, which grows on the surface of the uppermost semi-insulating Fe-doped InP layer 41, is kept excellent, thereby producing a highly reliable optical semiconductor device. Furthermore, since it includes no process of etching and removing only the portion of the n type InP hole blocking layer 9 between the DFB laser and the optical modulator, which is difficult to control, the yield of the optical semiconductor device can be improved.

As also described for the first embodiment, Ti-doped InP, Cr-doped InP, or non-doped AlGaAs can be used for the semi-insulating InP layer 41 in place of Fe-doped InP. In these cases, similar effects as when Fe-doped InP is used are obtained. However, when the Cr-doped InP is used, the conductivity types of respective layers must be opposite to those which are described with reference to FIG. 4.

In addition, while the burying layers 30 on both sides of the buried waveguide comprise three semi-insulating Fe-doped InP layers 41 and two n type InP hole blocking layers 42 alternately laminated on each other, a greater number of semi-insulating Fe-doped InP layers and n type InP hole blocking layers can be alternately laminated and similar effects obtained. However, the uppermost layer and the lowermost layer must be layers comprising semi-insulating Fe-doped InP.

What is claimed is:

1. An optical semiconductor device comprising:

a semiconductor substrate having a surface and a first conductivity type; and a plurality of optical semiconductor elements disposed on said surface of said semiconductor substrate and optically arranged in series, each of said optical semiconductor elements having a buried waveguide and burying semiconductor structures on opposite sides of said buried waveguide, said burying semiconductor structures continuously extending along said plurality of optical semiconductor elements, each of said burying semiconductor structures comprising a semi-insulating semiconductor layer and at least one pair of laminated layers disposed on said semi-insulating semi-conductor layer and comprising a charge carrier blocking layer having the first conductivity type, and a semi-insulating semi-conductor layer disposed on said charge carrier blocking layer.

2. The optical semiconductor device of claim 1 wherein said plurality of optical semiconductor elements includes a laser element and an optical modulator, and wherein said buried waveguides of said laser element and said optical modulator are a unitary continuous layer.

3. The optical semiconductor device of claim 1 wherein said semi-insulating semiconductor layer comprises InP doped with Fe, and said charge carrier blocking layer is n type.

4. The optical semiconductor device of claim 1 wherein said semi-insulating semiconductor layer comprises InP doped with Ti, and said charge carrier blocking layer is n type.

5. The optical semiconductor device of claim 1 wherein said semi-insulating semiconductor layer comprises InP doped with Cr, and said charge carrier blocking layer is p type.

6. The optical semiconductor device of claim 1 wherein said semi-insulating semiconductor layer comprises non-doped AlInAs.

* * * * *